(12) United States Patent
Ikarashi

(10) Patent No.: US 7,502,250 B2
(45) Date of Patent: Mar. 10, 2009

(54) MEMORY DEVICE

(75) Inventor: Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 63 days.

(21) Appl. No.: 11/770,183

(22) Filed: Jun. 28, 2007

(65) Prior Publication Data

US 2008/0043517 A1 Feb. 21, 2008

(30) Foreign Application Priority Data

Jul. 3, 2006 (JP) ............................ P2006-183684

(51) Int. Cl.
*G11C 11/00* (2006.01)
(52) U.S. Cl. ....................... 365/158; 365/171
(58) Field of Classification Search ................. 365/158, 365/171, 173
See application file for complete search history.

(56) References Cited

U.S. PATENT DOCUMENTS

| 5,695,864 | A | 12/1997 | Slonczewski |
| 7,372,727 | B2 * | 5/2008 | Nakamura et al. .......... 365/171 |
| 2003/0072174 | A1 | 4/2003 | Savtchenko et al. |
| 2005/0023938 | A1 * | 2/2005 | Sato et al. ................... 310/363 |
| 2007/0279972 | A1 * | 12/2007 | Higo et al. .................. 365/158 |

FOREIGN PATENT DOCUMENTS

| JP | 2003-011782 | 1/2003 |
| JP | 2004-277147 | 10/2004 |

OTHER PUBLICATIONS

J. Nahas et al., IEEE/ISSCC 2004, VisulasSupplement, p. 22.

* cited by examiner

*Primary Examiner*—Anh Phung
(74) *Attorney, Agent, or Firm*—Bell, Boyd & Lloyd LLP

(57) ABSTRACT

A memory device includes a memory element, a first wiring and a second wiring. The memory element includes a memory layer retaining information based on a magnetization state of a magnetic material and a magnetization pinned layer in which a magnetization direction is pinned and which is provided for the memory layer through a non-magnetic layer, in which current flows in a stacking direction to change a magnetization direction of the memory layer. The first wiring supplies current flowing in the stacking direction of the memory element, and the second wiring supplies current to apply a current magnetic field to the memory element. When information is recorded in the memory device, a first pulse current is supplied to the first wiring, a second pulse current is supplied to the second wiring, and the second pulse current falls at least 10 picoseconds after the first pulse current falls.

5 Claims, 8 Drawing Sheets

MEMORY DEVICE

CROSS REFERENCES TO RELATED APPLICATIONS

The present application claims priority to Japanese Patent Application JP 2006-183684 filed in the Japanese Patent Office on Jul. 3, 2006, the entire contents of which being incorporated herein by reference.

BACKGROUND

The present application relates to a memory device that includes a memory element having a memory layer which stores a magnetization state of a magnetic material as information and a magnetization pinned layer in which a magnetization direction is pinned. A magnetization direction of the memory layer is changed by supplying current, and the memory device is suitably applied to a nonvolatile memory.

Since information communicating apparatuses, in particular, small-sized apparatuses for personal use such as portable communication terminals have been widely used, further high performance such as higher integration, higher operation speed and lower electric power usage is requested for a memory element, logic element or the like included in such apparatuses.

Specifically, a nonvolatile memory may be a necessary component for highly-functional apparatuses.

As a nonvolatile memory, a semiconductor flash memory, FeRAM (Ferroelectric Random Access Memory) or the like has been used and further research and development have been carried out for higher performance.

Lately, as a nonvolatile memory using a magnetic material, MRAM (Magnetic Random Access Memory) using tunnel magneto-resistance effects has been developed and attracting attention (for example, refer to "J. Nahas et al., IEEE/ISSCC 2004 Visulas Supplement, p. 22").

MRAM includes regularly-arranged minute memory elements in which information is recorded and wiring such as a word line and a bit line provided to access each of the memory element.

Each magnetic memory element is configured to have a memory layer in which information is recorded as a magnetization direction of a ferromagnetic material.

The magnetic memory element employs a structure using MTJ (Magnetic Tunnel Junction), including the above-described memory layer, a tunnel insulating film (non-magnetic spacer) and a magnetization pinned layer where a magnetization direction is pinned. The magnetization direction of the magnetization pinned layer may be pinned by providing an anti-ferromagnetic layer, for example.

In such structure, a tunnel magneto-resistance effect is caused, in which a resistance value to tunnel current flowing through a tunnel insulating film changes in accordance with an angle between the magnetization direction of the memory layer and the magnetization direction of the magnetization pinned layer. Accordingly, information is written (recorded) using the tunnel magneto-resistance effect. The resistance value becomes maximum when the magnetization direction of the memory layer and the magnetization direction of the magnetization pinned layer are anti-parallel, and becomes minimum when these are parallel.

Information is written (recorded) to the above-described magnetic memory element by controlling a magnetization direction of the memory layer in the magnetic memory element using a combined current magnetic field caused by supplying current to both of a word line and a bit line. Typically, magnetization directions are stored corresponding to information "0" and information "1", respectively.

Japanese Unexamined Patent Application Publication No. H10-116490, for example, discloses a method using an asteroid characteristic, and U.S. Patent Application Publication No. 2003/0072174, for example, discloses a method using a switching characteristic, in order to record information into the memory element.

On the other hand, in order to read recorded information, the recorded information may be detected by detecting a difference between the magnetization directions of the memory layer as a difference between voltage signals using the tunnel magneto-resistance effect of the magnetic memory element after a memory cell is selected using an element such as a transistor.

MRAM has such an advantage that the information "0" and information "1" are rewritten by inverting the magnetization direction of the memory layer formed of a ferromagnetic material and therefore information can be rewritten at high speed and without a limit of times ($>10^{15}$ times) as compared with other nonvolatile memories.

However, a comparatively intensive current magnetic field may be required for MRAM in order to rewrite recorded information. Therefore, a certain amount of current (for example, several mA to several tens mA) may need to be applied to address wirings. Thus, power consumption may be large.

Further, MRAM may require address wiring for the writing and address wiring for the reading separately, and therefore it is difficult for a memory cell to be miniaturized.

Furthermore, with a memory element miniaturized, such problems as described below may occur. Accordingly, address wiring becomes thin and it is difficult to apply a sufficient amount of current thereto, and power consumption increases due to the intensive current magnetic field required for large coercive force.

Therefore, it has been difficult to miniaturize the element.

U.S. Pat. No. 5,695,864, for example, discloses a method for coping with such problems, in which recording without using a current magnetic field is studied and, in particular, a memory that uses magnetization inversion based on spin-transfer attracts attention as a configuration in which the magnetization direction can be inverted with less current.

Japanese Unexamined Patent Application Publication No. 2003-17782, for example, discloses magnetization inversion based on spin-transfer, in which electrons passing through a magnetic material and being spin-polarized are injected into other magnetic materials to cause the magnetization inversion.

Specifically, when spin-polarized electrons passing through a magnetic layer where a magnetization direction is pinned (magnetization pinned layer) enter another magnetic layer where magnetization direction is not pinned (magnetization free layer), spin-transfer torque is given to magnetization of the magnetization free layer. When current of a threshold value or more flows, the magnetization direction of the magnetic layer (magnetization free layer) may be inverted.

For example, if current is applied in the direction perpendicular to a film surface of a great magneto-resistance effect element (GMR element) or of a magnetic tunnel junction element (MTJ element) which includes a magnetization pinned layer and a magnetization free layer, the magnetization direction of at least a part of the magnetic layers of those elements may be inverted.

Accordingly, a memory element including a magnetization pinned layer and a magnetization free layer (memory layer) is formed, in which a polarity of current flowing through the memory element is changed to invert a magnetization direction of the memory layer, thereby rewriting information "0" and information "1".

A tunnel magneto-resistance effect is used similarly to MRAM by providing a tunnel insulating layer between the magnetization pinned layer and the magnetization free layer (memory layer), thereby reading recorded information.

Magnetization inversion by spin-transfer has an advantage that the magnetization inversion may be realized without increasing an amount of current even though an element is reduced in size.

An absolute value of current flowing through the memory element to cause the magnetization inversion is 1 mA or less in the memory element of about 0.1 μm, for example, and the absolute value is reduced in proportion to a volume of the memory element, which is advantageous in scaling.

Further, since a recording word line that is necessary for MRAM is unnecessary, there is such an advantage that a configuration of a memory cell is simplified.

A memory element using spin-transfer is hereinafter called SpRAM (Spin-transfer Random Access Memory) and spin-polarized current that causes the spin-transfer is called spin injection current.

SpRAM is expected as a nonvolatile memory consuming less electric power and having large capacity while keeping advantages of MRAM that operates at high speed and can be rewritten without a limit of times.

FIG. 1 is a schematic sectional view showing a memory cell in a memory (SpRAM) that uses typical spin-transfer.

A diode or MOS transistor or the like may be used to electrically select a memory cell in order to read information recorded in the memory cell. The memory cell shown in FIG. 1 uses a MOS transistor.

First, a configuration of a memory element 101 forming a memory cell of SpRAM is described.

An anti-ferromagnetic bond is formed between a first magnetization pinned layer 112 and a second magnetization pinned layer 114 through a non-magnetic layer 113. Further, the first magnetization pinned layer 112 is provided in contact with an anti-ferromagnetic layer 111 and has a strong unidirectional magnetic anisotropy caused by exchange interaction between the layers. A pinned layer 102 is configured to have the four layers 111, 112, 113 and 114. Specifically, the pinned layer 102 includes two magnetic layers (first magnetization pinned layer 112 and second magnetization pinned layer 114).

A ferromagnetic layer 116 is configured such that a direction of magnetization M1 is inverted comparatively easily to form a memory layer (magnetization free layer) 103.

A tunnel insulating layer 115 is formed between the second magnetization pinned layer 114 and the ferromagnetic layer 116, specifically, between the pinned layer 102 and the memory layer (magnetization free layer) 103. The tunnel insulating layer 115 disconnects a magnetic bond between the magnetic layers 116 and 114 stacked in a vertical direction and supplies tunnel current. Thus, a TMR (tunnel magneto-resistance) element is configured to have the pinned layer 102 in which the magnetization directions of the magnetic layers are pinned, the tunnel insulating layer 115 and the memory layer (magnetization free layer) 103 in which the magnetization direction can be changed.

Thus, the memory element 101 includes each of the layers 111 to 116 as described above, a ground layer 110 and a topcoat layer 117 to form the TMR element.

A selection MOS transistor 121 is formed in a silicon substrate 120, and a connecting plug 107 is formed on a diffusion layer 123 that is one of diffusion layers provided for the selection MOS transistor 121. The ground layer 110 of the memory element 101 is provided on the connecting plug 107 to be connected thereto. The other diffusion layer 122 of the selection MOS transistor 121 is connected to a sense line through the connecting plug, although not shown in FIG. 1. A gate 106 of the selection MOS transistor 106 is connected to a selective signal line.

The topcoat layer 117 in the memory element 101 is connected to a bit line (BL) 105 provided on top thereof.

In a steady state, magnetization M11 of the first magnetization pinned layer 112 and magnetization M12 of the second magnetization pinned layer 114 are in almost a perfect anti-parallel state based on a strong anti-ferromagnetic bond through the non-magnetic layer 113.

Typically, the first magnetization pinned layer 112 and the second magnetization pinned layer 114 are configured to have equal products of saturation magnetization and film thickness, and therefore a leakage component of a magnetic pole and magnetic field is sufficiently small to be negligible.

A resistance value of TMR element including the layers 114, 115 and 116 is changed depending on whether the direction of magnetization M1 of the ferromagnetic layer 116 that is the memory layer 103 and the direction of magnetization M12 of the second magnetization pinned layer 114 included in the pinned layer 102 are in a parallel state or an anti-parallel state through the tunnel insulating layer 115. The resistance value is low if two of the magnetizations M1, M12 are in the parallel state and the resistance value is high if these are in the anti-parallel state. A whole resistance value of the memory element 101 also changes when the resistance value of TMR element (layers 114, 115, and 116) is changed. Information can be recorded and the recorded information can be read using the above described changes. Specifically, a state where the resistance value is low is assigned to information "0", for example, and a state where the resistance value is high is assigned to information "1", thereby binary (1 bit) information being recorded.

In order to rewrite information in the memory cell and to read information recorded in the memory cell, it may be necessary to supply spin injection current Iz. The spin injection current Iz passes through the memory element 101, the diffusion layer 123 and the bit line 105.

A direction of the spin injection current Iz flowing through the memory element 101 may be changed from an upward direction to a downward direction, or vice versa, by changing a polarity of the spin injection current Iz.

Accordingly, information in the memory cell may be rewritten by changing the direction of magnetization M1 of the memory layer 103 in the memory element 101.

Japanese Unexamined Patent Application Publication No. 2005-277147 discloses a configuration of SpRAM in which not only spin injection current is supplied to the memory element, but also a bias current magnetic field is applied to the memory element and other elements, in order to invert magnetization direction of a memory layer in a memory element.

Specifically, for example, in a configuration shown in FIG. 1, spin injection current Iz is supplied to a memory element 101 through a bit line 105, and a bias current magnetic field Hx (not shown) caused by current flowing in the bit line 105 (equal to the spin injection current Iz) is applied to the memory layer 103 in the memory element 101.

Thus, a direction of magnetization M1 of the memory layer 103 can be changed efficiently.

A diagram showing a state of a memory cell is hereinafter called a phase diagram in which a vertical axis represents spin injection current Iz and a horizontal axis represents a bias current magnetic field Hx. Here, the phase diagram is prepared using a peak value of pulse current, in the case of using pulse current as bias current that causes spin injection current Iz and a bias current magnetic field Hx.

FIG. 2 shows an example of an apparatus that measures values for a phase diagram of SpRAM. The apparatus shown in FIG. 2 uses a Helmholtz coil 72 instead of a bit line to generate a bias current magnetic field Hx, and bias current Ib flowing in the Helmholtz coil 72 is supplied independently from an external power supply 71.

The spin injection current Iz flows from or flows out to another driving circuit through the bit line 105 connected to the memory cell.

A direction of magnetization M1 of the ferromagnetic layer 116 that is the memory layer 103 may be changed with the spin injection current Iz and bias current magnetic field Hx.

Using the apparatus shown in FIG. 2, intensity and phase of the spin injection current Iz and bias current magnetic field Hx may optionally be set and values for a phase diagram may be measured.

As described above, in a typical SpRAM, information in the memory cell is rewritten by changing a polarity of the spin injection current Iz. However, there is a case in which a result of magnetization inversion (inverted, or not inverted) may not necessarily be determined with a polarity of the spin injection current alone due to instability in the magnetization inversion phenomenon using spin-transfer.

In such case, in order to securely invert magnetization, an auxiliary bias magnetic field may be needed.

However, when spin injection current Iz and a bias current magnetic field Hx are generated using the same bit line as proposed in Japanese Unexamined Patent Application Publication No. 2005-277147, intensity and phases of the spin injection current Iz and the bias current magnetic field Hx may not be set independently. For example, intensity of the spin injection current and intensity of the bias current may not be adjusted independently and optionally, and timing of the spin injection current, timing for applying the bias magnetic field and a polarity thereof may not be adjusted independently.

Therefore, in a typical SpRAM including a configuration proposed in Japanese Unexamined Patent Application Publication No. 2005-277147, since a condition in the case of rewriting information in a memory cell is restricted, for example, it is difficult to optimize the condition so that electric power consumption may be minimized and the rewriting may be performed at high speed.

Further, instability in the above-described magnetization inversion phenomenon using spin-transfer may not be sufficiently prevented, because the condition in the case of rewriting information in a memory cell is restricted.

Here, FIG. 3A shows the case in which a configuration proposed in Japanese Unexamined Patent Application Publication No. 2005-277147 is applied to a memory cell shown in FIG. 1, and shows each timing of pulse current of spin injection current Iz and of pulse current of bias current Ib that generates a bias current magnetic field.

As shown in FIG. 3A, both of spin injection current Iz and bias current Ib have rectangular pulses in order to simplify an explanation. $t_0$ shows an initial condition; $t_1$ and $t_2$ show the time of the spin injection current Iz and bias current Ib rising respectively; and $t_3$ and $t_4$ show the time of the spin injection current Iz and bias current Ib falling respectively; and $t_s$ shows the time at which a finished condition is observed.

Duration of each pulse is $t_3-t_1$ for the spin injection current Iz and is $t_4-t_2$ for bias current Ib. The spin injection current Iz is switched off before $t_1$, and is switched on at $t_1$, and is switched off at $t_3$.

In such case, part of current flowing through the bit line 105 is used as spin injection current Iz and the other is used as bias current Ib to generate a bias current magnetic field Hx. Therefore, the spin injection current Iz and the bias current Ib are supplied to the bit line 105 from the same driving power supply, and so the injection current Iz and the bias current Ib may not be applied at a different timing.

Consequently, time $t_1$ of rising 91 in a pulse of the spin injection current Iz and time $t_2$ of rising 92 in a pulse of the bias current Ib will surely be the same time.

Subsequently, FIGS. 3B and 3C show examples of change in electric resistance of the memory element 101 over time when a typical SpRAM is used. Two curves in FIGS. 3B and 3C correspond to spin injection current Iz ±2.5 mA that exceeds a threshold value for inverting a magnetization direction, respectively. Here, duration ($t_3-t_1$ in FIG. 3A) for a pulse of the spin injection current Iz is 5 ns (nanoseconds) and a peak value of a pulse of the bias current Ib is zero. Also, $t_s-t_1$ in FIG. 3A is 10 ns.

FIG. 3B shows an example in which an initial resistance is started from a low resistance state ("0" state) and a magnetization direction can be normally inverted.

As shown in FIG. 3B, a high resistance state inverted from the initial state (a low resistance state) can be obtained under a condition where a peak value of spin injection current Iz is −2.5 mA, and a low resistance state remains unchanged as the initial state under a condition where a peak value of spin injection current Iz is +2.5 mA.

On the other hand, FIG. 3C shows an example in which an initial resistance is started from a high resistance state (state "1") and magnetization direction may not be inverted.

As shown in FIG. 3C, a low resistance state inverted from an initial state is temporarily obtained under a condition where a peak value of spin injection current Iz is +2.5 mA; however, the resistance state returns to the original high resistance state when the spin injection current Iz is turned off after passing 5 ns, and a high resistance state remains unchanged as the initial state under a condition where a peak value of spin injection current Iz is −2.5 mA.

A phenomenon in which switching from a high resistance as an initial resistance shown in FIG. 3C may not be inverted normally is observed in the following cases. Specifically, in the case where magnetization M1 of the memory layer (magnetization free layer) 103 does not reach a parallel state due to short duration for spin injection current Iz, in the case where an inverse magnetic domain is generated in a part of the magnetization free layer 103 in a switching process where a magnetization direction changes, or in the case where magnetization M11 or M12 of the pinned layer 102 that may not change basically moves a little by huge spin torque.

Spin torque tends to increase along a current magnetic field in spiral shape formed by the spin injection current Iz, and therefore an inverse magnetic domain of a pattern that resists the current magnetic field in spiral shape formed by the spin injection current Iz is formed in a magnetization free layer 103.

SpRAM is an excellent memory in which current (inversion threshold current) necessary for inverting a magnetization direction of a memory layer can be reduced using spin torque, and intensity of spin torque is huge that easily exceeds torque caused by a static magnetic field which increases in inverse proportion to the size of an element.

Thus, SpRAM has a characteristic that if the size of an element is small, it is advantageous to obtain more inversion threshold current; however, the huge spin torque may cause instability in a spin-transfer magnetization inversion phenomenon. With such instability, a phenomenon in which a magnetization direction may not be inverted by a polarity of the spin injection current alone is observed, as shown in FIG. 3C.

Next, a relationship between the above-described phenomenon and a phase diagram is explained.

A typical phase diagram includes: a hysteresis area 80; an area 81 where a memory cell is in "0" state (low resistance state) regardless of an initial magnetization state; an area 82 where a memory cell is in "1" state (high resistance state) regardless of an initial magnetization state; and an unstable operation area 83 where the above-described three areas coexist.

In order to function as a memory in which SpRAM has a realistic margin (operating margin), three areas (hysteresis area 80, "0" state area 81 and "1" state area 82) may need to independently exist as sufficiently wide areas respectively.

As shown in FIG. 3C, a phenomenon in which a magnetization direction may not normally be inverted by a polarity of spin injection current Iz alone appears on a phase diagram as an unstable operation area 83 where two or more states coexist in the "0" state area 81 and in the "1" state area 82.

FIG. 4 shows an example of a measured phase diagram of a typical SpRAM in which duration of spin injection current Iz and that of bias current Ib are 5 ns.

The phase diagram shown in FIG. 4 is a diagram showing a state of a memory cell in a switching finished condition (for example, $t_5$ in FIG. 3A) with a peak value of a pulse of spin injection current Iz as a vertical axis and a peak value of a pulse of a bias current magnetic field Hx as a horizontal axis.

As shown in FIG. 4, the unstable operation area 83 where the three states 80, 81, 82 coexist appears upper right in the figure (first quadrant) and lower left in the figure (third quadrant).

It should be noted that the "0" state area 81 appears on the second quadrant, the "1" state area 82 appears on the fourth quadrant and the unstable operation area 83 appears on the first and third quadrants in FIG. 4, however, these are not necessarily universal characteristics. Depending on a method of defining the direction of spin injection current Iz and the directions of magnetization M11 and magnetization M12 of the pinned layer 102, the "0" state area 81, the "1" state area 82 and the unstable operation area 83 may appear on different quadrants from those shown in FIG. 4.

In the case where the unstable operation area 83 appears in the phase diagram as shown in FIG. 4, spin injection current Iz and bias current Ib when performing magnetization inversion may need to be set to the outside of the unstable operation area 83.

However, it may be difficult to set current so as not to be in the unstable operation area 83 in such a configuration that the currents Iz, Ib are supplied from the same bit line.

SUMMARY

Therefore, it is desirable to set conditions so that each value of the current is in the outside of the unstable operation area 83; a magnetization direction of the memory layer is inverted stably and surely; and information is recorded stably.

In view of the above, it is desirable to provide a memory device which is highly reliable and in which information is recorded stably.

According to an embodiment, there is provided a memory device including: a memory element, a first wiring and a second wiring. The memory element includes a memory layer that retains information based on a magnetization state of a magnetic material and a magnetization pinned layer in which a magnetization direction is pinned and which is provided for the memory layer through a non-magnetic layer. Information is recorded by changing the magnetization direction of the memory layer by supplying current in a stacking direction. The first wiring supplies current flowing in the stacking direction of the memory element and the second wiring supplies current to apply a current magnetic field to the memory element. When information is recorded, a first pulse current is supplied to the first wiring, a second pulse current is supplied to the second wiring, and the second pulse current falls at least 10 picoseconds after the first pulse current falls.

The memory device according to the embodiment includes: a memory element, a first wiring and a second wiring. The memory element includes a memory layer that retains information based on a magnetization state of a magnetic material and a magnetization pinned layer in which magnetization direction is pinned and which is provided through a non-magnetic layer. Information is recorded by changing the magnetization direction of the memory layer by supplying current in a stacking direction. Since the first wiring supplies current flowing in the stacking direction of the memory element and the second wiring supplies current to apply a current magnetic field to the memory element, information may be recorded by changing a magnetization state (magnetization direction) of the memory layer by spin-transfer, that is, by supplying current in the stacking direction of the memory element using the first wiring.

Further, since the memory device includes a second wiring that supplies current to apply a current magnetic field to the memory element, current is supplied to the second wiring, the magnetic field is applied to the memory element, and a magnetization direction of a memory layer in the memory element can be changed by an operation of the magnetic field. Thus, an operation of recording information may be performed easily by changing the magnetization direction of the memory layer.

Further, since the second wiring is provided separately from the first wiring that supplies current flowing in the stacking direction of the memory element, a magnetic field caused by current flowing through the second wiring and current supplied to the first wiring can be set independently.

Furthermore, when information is recorded, a first pulse current is supplied to the first wiring and a second pulse current is supplied to the second wiring, and the second pulse current falls at least 10 picoseconds after the first pulse current falls. Accordingly, an operation of changing a magnetization state of the memory layer can be performed stably and surely by reducing instability in the operation of changing the magnetization state by spin-transfer.

According to an embodiment, an operation of changing a magnetization state of the memory layer can be performed stably and surely. Therefore, a memory device may have characteristics of a memory device in which information is recorded using spin-transfer as described below. Specifically, the memory device may have larger capacity, may be reduced in size, may consume less power or the like, with a memory element being miniaturized, and also the memory device an operation of which is stabilized and which has high reliability may be obtained.

Additional features and advantages are described herein, and will be apparent from, the following Detailed Description and the figures.

BRIEF DESCRIPTION OF THE FIGURES

FIGS. 3A to 3C are diagrams, in which FIG. 3A shows change in each of current pulses of spin injection current and bias current over time, and FIGS. 3B and 3C show an example of change in electric resistance of a memory element by an applied current pulse over time;

DETAILED DESCRIPTION

Figure 5:
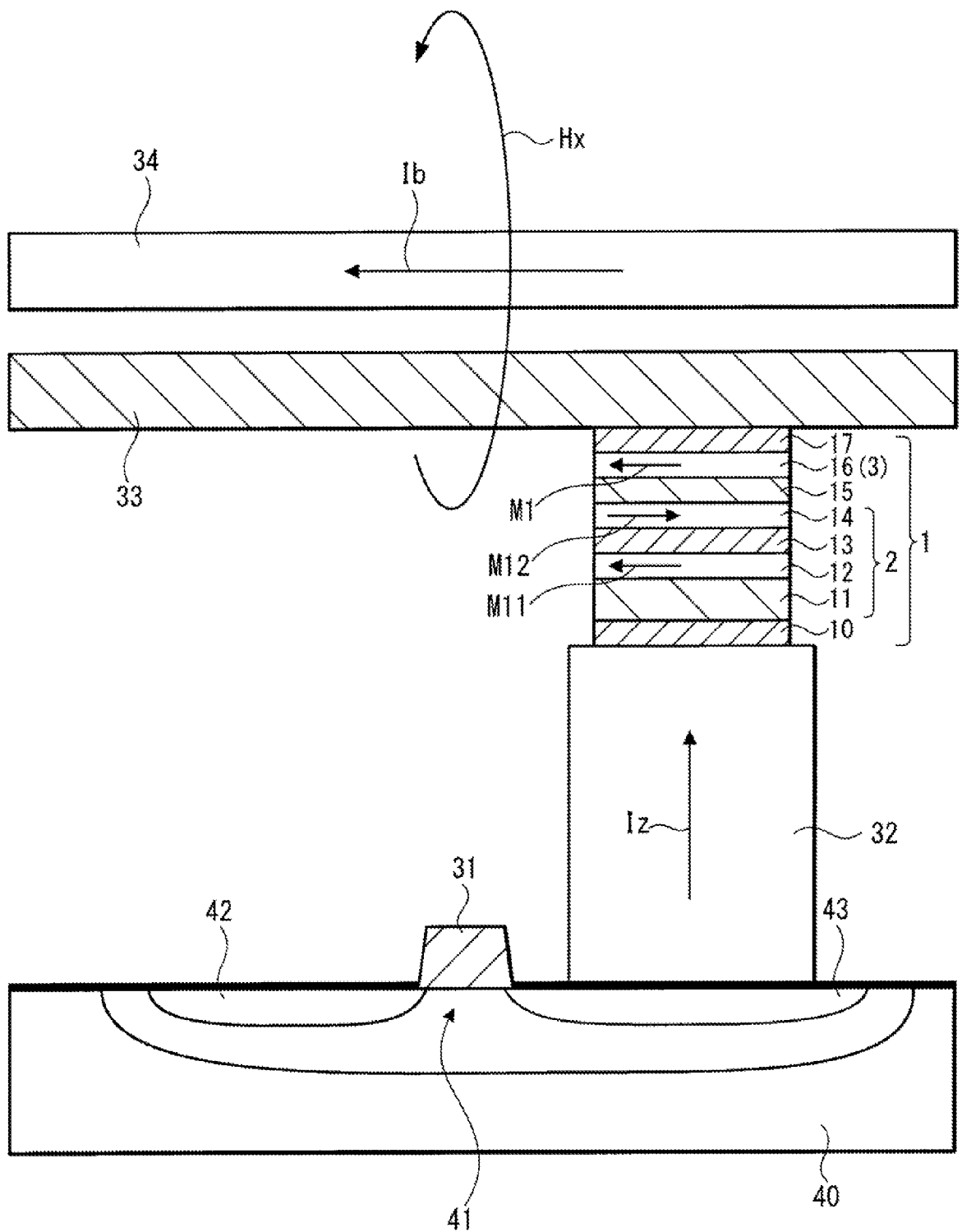
FIG. 5 is a schematic sectional view of a memory cell in a memory device according to an embodiment.

FIG. 5 shows a schematic sectional view of a memory cell (SpRAM memory cell) of a memory device according to an embodiment.

Figure 1:
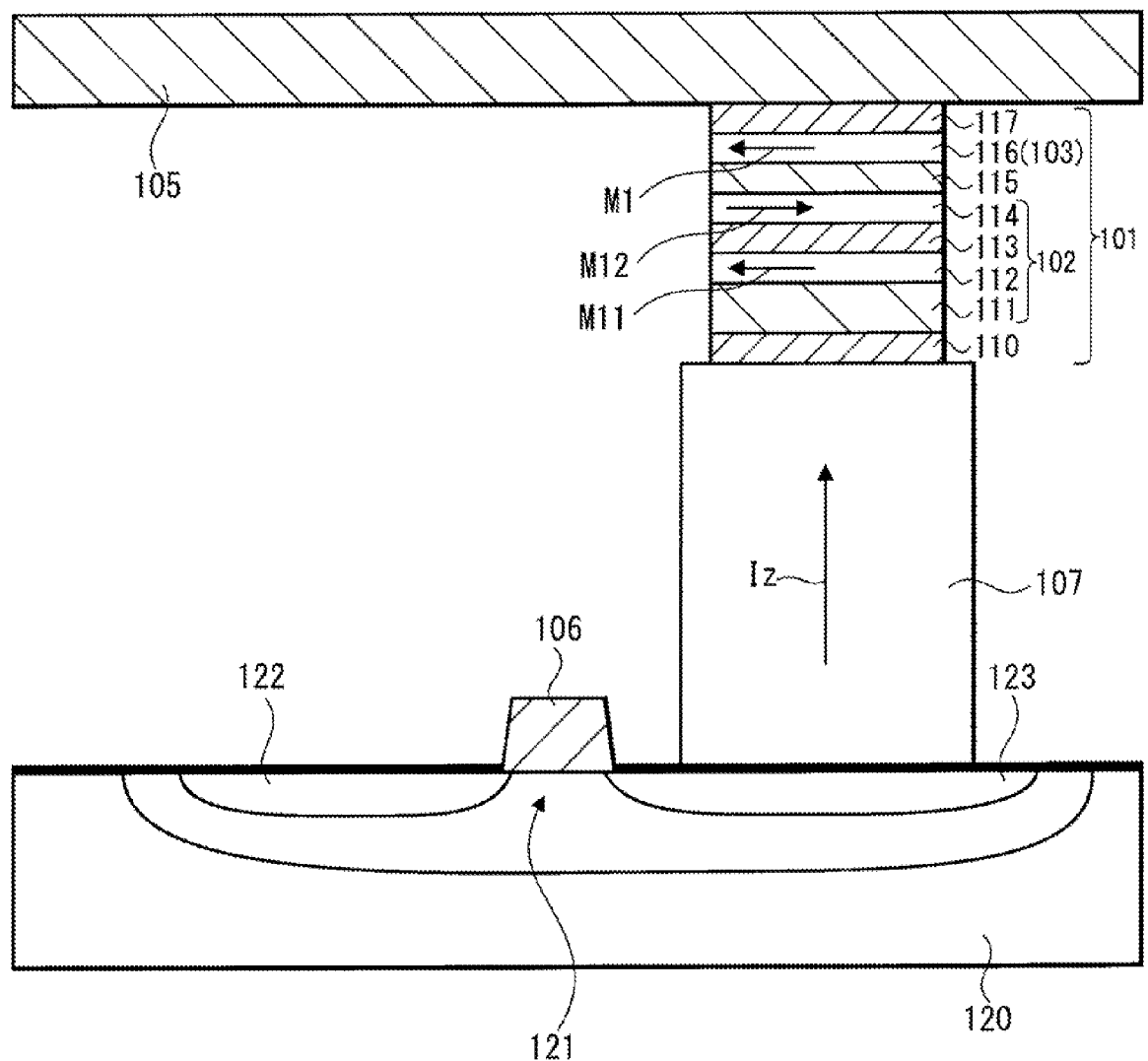
FIG. 1 is a schematic sectional view of a memory cell in a memory that uses spin-transfer according to related art.
Figure 2:
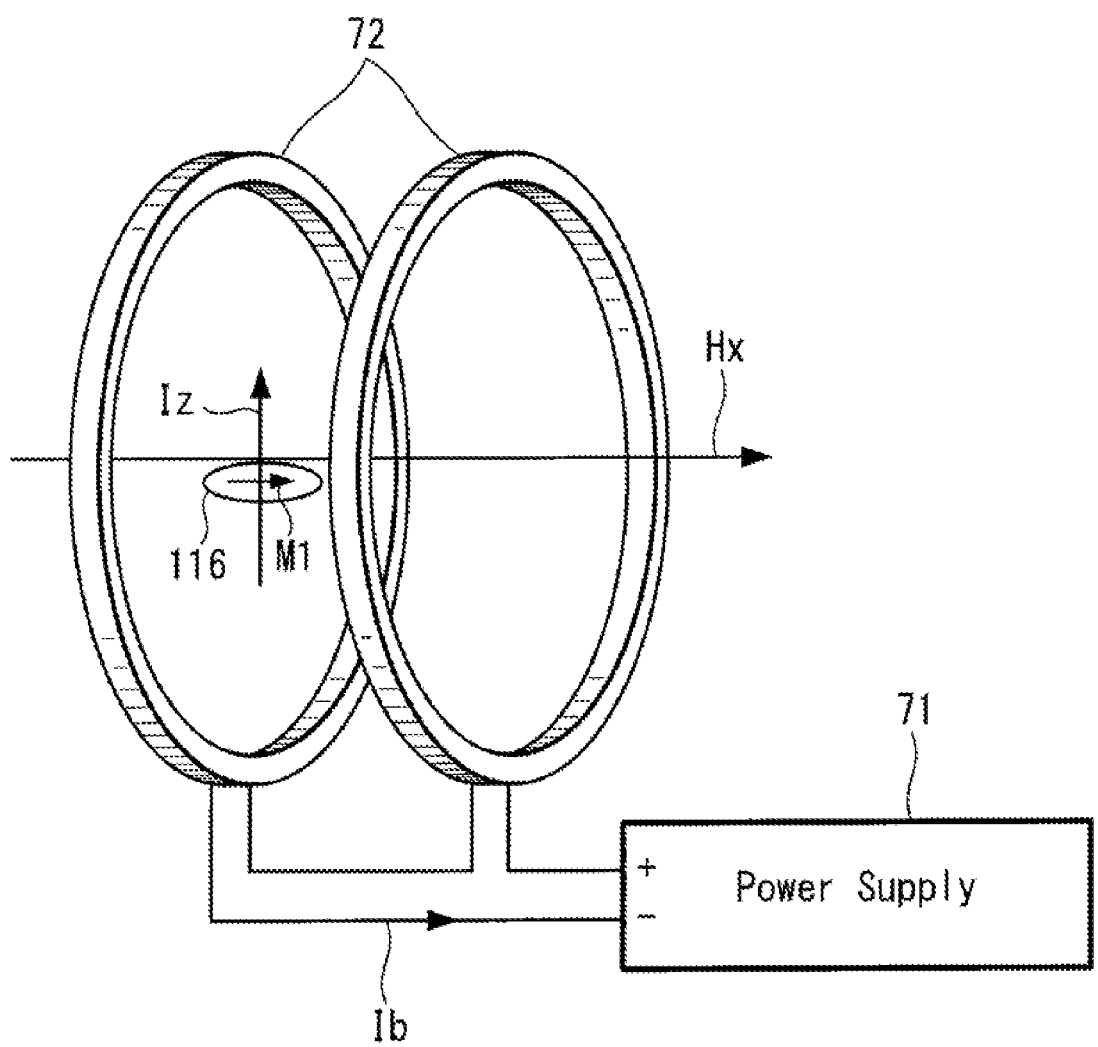
FIG. 2 shows an example of an apparatus used for measurement for a phase diagram.

Similarly to a typical SpRAM memory cell shown in FIG. 1, a selection MOS transistor is used for reading information from the memory cell in the embodiment.

First, a configuration of a memory element 1 forming a SpRAM memory cell is described. The memory element 1 has a structure similar to a memory element 101 of a memory cell shown in FIG. 1.

An anti-ferromagnetic bond is formed between a first magnetization pinned layer 12 and a second magnetization pinned layer 14 through a non-magnetic layer 13. Further, the first magnetization pinned layer 12 is provided in contact with an anti-ferromagnetic layer 11 and has a strong unidirectional magnetic anisotropy caused by exchange interaction between the layers. A pinned layer 2 is configured to have the four layers 11, 12, 13 and 14. Specifically, the pinned layer 2 includes two magnetic layers (first magnetization pinned layer 12 and second magnetization pinned layer 14).

A ferromagnetic layer 16 is configured such that a direction of magnetization M1 is inverted comparatively easily to form a memory layer (magnetization free layer) 3.

A tunnel insulating layer 15 is formed between the second magnetization pinned layer 14 and the ferromagnetic layer 16, specifically, between the pinned layer 2 and the memory layer (magnetization free layer) 3. The tunnel insulating layer 15 disconnects a magnetic bond between the magnetic layers 16 and 14 stacked in a vertical direction and supplies tunnel current. Thus, a TMR (tunnel magneto-resistance) element is configured to have the pinned layer 2 in which the magnetization direction of the magnetic layers is pinned, the tunnel insulating layer 15 and the memory layer (magnetization free layer) 3 in which the magnetization direction can be changed.

A topcoat layer 17 is formed on the memory layer 16. The topcoat layer 17 prevents diffusion and reduces contact resistance between the wiring (bit line) 33 and the memory element 1 connected thereto, and prevents oxidation of the memory layer 3.

A ground layer 10 is formed under the anti-ferromagnetic layer 11. The ground layer 10 has a function of improving crystallization of layers stacked upward.

For example, nickel, iron, cobalt, or a ferromagnetic material including alloys thereof as a main component is used for the first and second magnetization pinned layers 12, 14 and the ferromagnetic layer 16 of the memory layer 3.

For example, tantalum, chromium, ruthenium or the like may be used as a material for the non-magnetic layer 13.

For example, manganese alloys including iron, nickel, platinum, iridium, rhodium or the like, cobalt or nickel oxide or the like may be used as a material for the anti-ferromagnetic layer 11.

For example, an insulator formed of oxide or nitride including aluminum, magnesium, silicon or the like may be used as a material for the tunnel insulating layer 15.

For example, chromium, tantalum or the like may be used for the ground layer 10.

For example, a material of copper, tantalum, TiN or the like may be used for the topcoat layer 17.

Among the layers, the magnetic layers 12, 14, 16 and conductive layers 10, 13, 17 are mainly formed by a sputtering method.

The tunnel insulating layer 15 may be obtained by oxidizing or nitrifying a metal film formed by the sputtering method.

The memory element 1 is formed with TMR element including each of the layers 11 to 16, the ground layer 10 and the topcoat layer 17.

A selection MOS transistor 41 is formed in a silicon substrate 40, and the ground layer 10 of the memory element 1 is connected to one diffusion layer 43 provided for the selection MOS transistor 41 through a connecting plug 32. The other diffusion layer 42 of the selection MOS transistor 41 is connected to a sense line through the connecting plug, although not shown in FIG. 5. A gate 31 of the selection MOS transistor 41 is connected to a selective signal line.

The topcoat layer 17 in the memory element 1 is connected to a bit line (BL) 33 on top thereof.

In a steady state, magnetization M11 of the first magnetization pinned layer 12 and magnetization M12 of the second magnetization pinned layer 14 are in almost a perfect anti-parallel state based on a strong anti-ferromagnetic bond through the non-magnetic layer 13.

Typically, the first magnetization pinned layer 12 and the second magnetization pinned layer 14 are configured to have equal products of saturation magnetization and film thickness, and therefore a leakage component of a magnetic pole and magnetic field is sufficiently small to be negligible.

A resistance value of TMR element including the layers 14, 15 and 16 is changed depending on whether the direction of magnetization M1 of the ferromagnetic layer 16 that is the memory layer 3 and the direction of magnetization M12 of the second magnetization pinned layer 14 included in the pinned layer 2 are in a parallel state or in an anti-parallel state through the tunnel insulating layer 15. The resistance value is low if two of the magnetizations M1, M12 are in the parallel state and the resistance value is high if these are in the anti-parallel state. A whole resistance value of the memory element 1 also changes when the resistance value of TMR element (layers 14, 15, and 16) is changed. Information can be recorded and the recorded information can be read using the above described changes. Specifically, a state where the resistance value is low is assigned to information "0", for example, and a state where the resistance value is high is assigned to information "1", thereby binary (1 bit) information being recorded.

In order to rewrite information in the memory cell and to read information recorded in the memory cell, it may be necessary to supply spin injection current Iz. The spin injection current Iz passes through the memory element 1, the diffusion layer 43 and the bit line 33.

A direction of the spin injection current Iz flowing in the memory element 1 may be changed from an upward direction to a downward direction, or vice versa, by changing a polarity of the spin injection current Iz.

Accordingly, information in the memory cell may be rewritten by changing the direction of magnetization M1 of the memory layer 3 in the memory element 1.

The memory device according to the above-described embodiment, in particular, has a second bit line 34 in addition to the bit line (a first bit line) 33 that supplies spin injection current Iz to the memory element 1.

Figure 6:
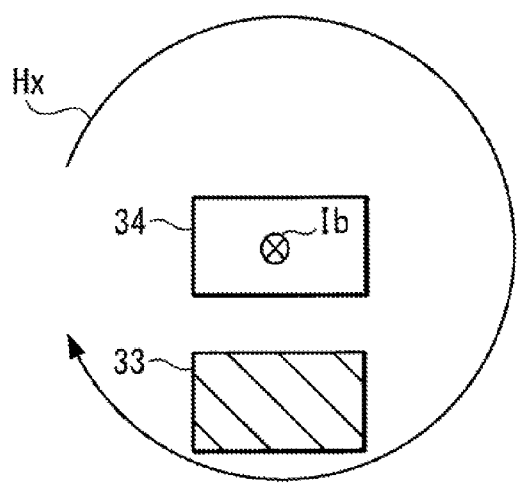
FIG. 6 is a side-sectional view of bit lines shown in FIG. 5.

The first bit line 33 and second bit line 34 are provided in a vertical direction in parallel with an interval in between. FIG. 6 shows a side-sectional view of the bit lines 33, 34 shown in FIG. 5.

The aforementioned bias current Ib flows through the second bit line 34. A bias current magnetic field Hx is caused around the second bit line 34 by the bias current Ib flowing through the second bit line 34. Here, the bias current Ib is supplied only when a magnetization state of the memory layer 3 is changed to record (write) information.

It should be noted that it is desirable that the second bit line 34 is provided separately from the first bit line 33 with a distance of at least 1 nm so as to secure electrical insulation.

Though a magnetic field is typically represented by a vector, a section of the second bit line 34 is set such that a main scalar component of the bias current magnetic field Hx corresponds with a magnetization easy axis of the memory layer 3. For example, if the magnetization easy axis of the memory layer 3 is in a horizontal direction in FIG. 6, it is ideal that the section of the second bit line 34 is square or rectangular.

Further, the spin injection current Iz flowing through the first bit line 33 and the bias current Ib flowing through the second bit line 34 are both used as current pulses according to the embodiment, and there is a characteristic in a relationship between timing of a current pulse of spin injection current Iz and timing of a current pulse of bias current Ib.

Figure 7:
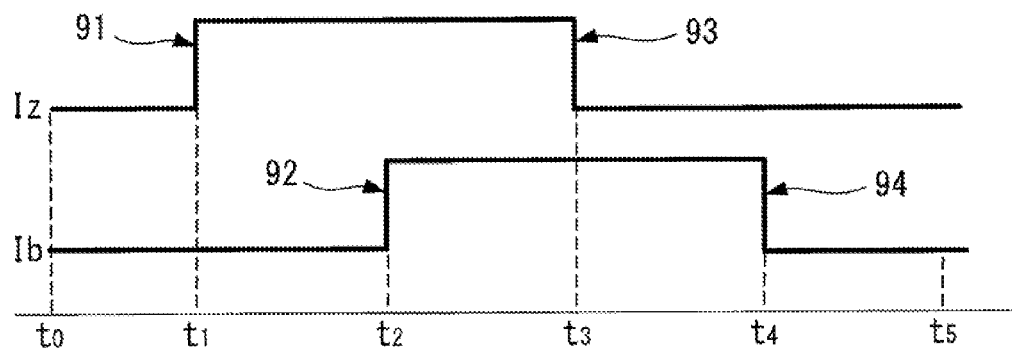
FIG. 7 is a diagram showing change in current pulses over time according to an embodiment.

FIG. 7 shows each timing (change over time) of a pulse of spin injection current Iz and a pulse of bias current Ib according to the embodiment.

Figure 3A:
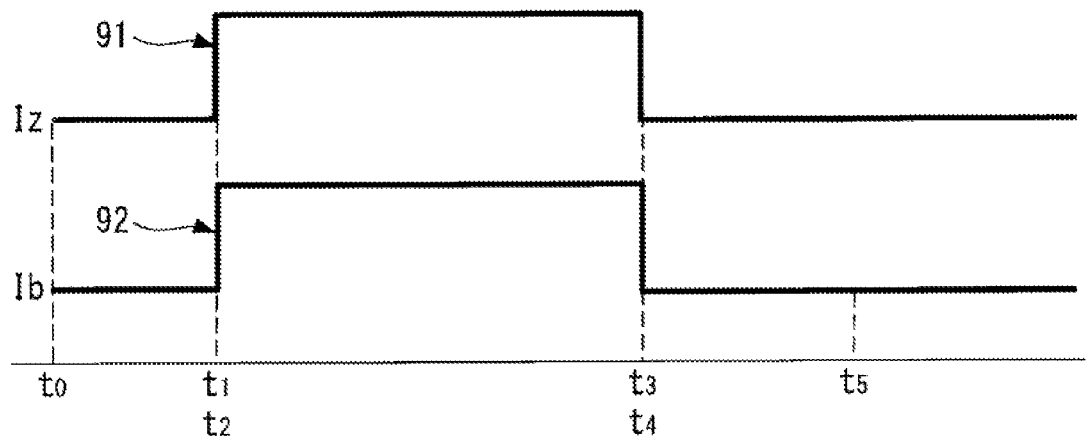
Figure 3B:
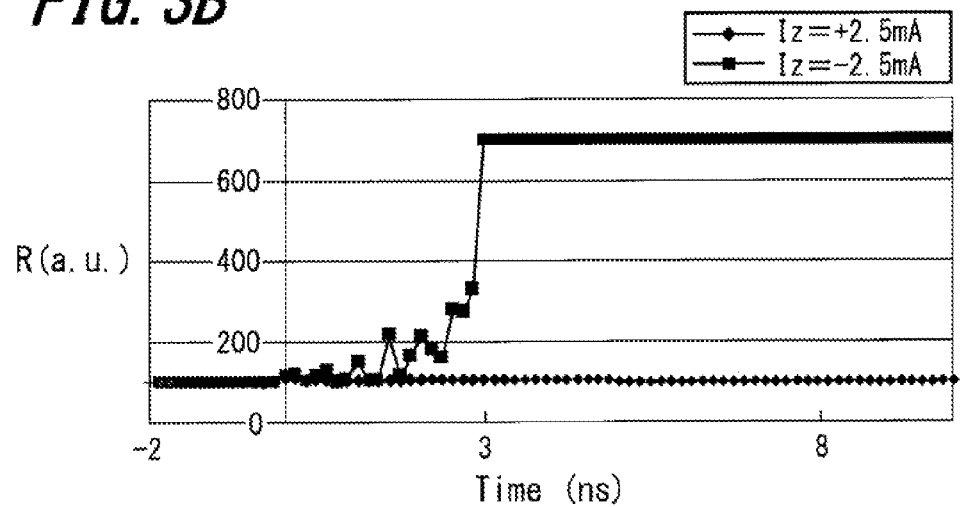
Figure 3C:
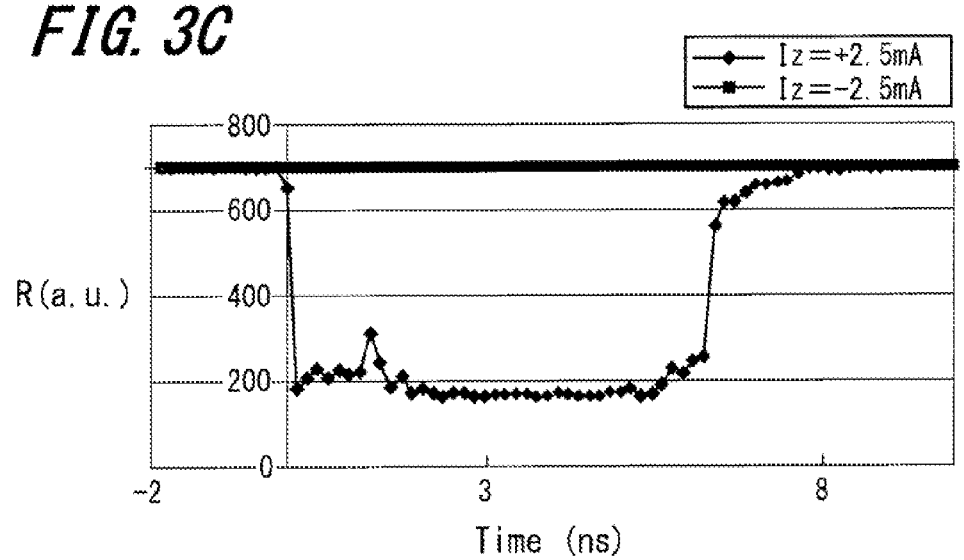

As shown in FIG. 7, both of spin injection current Iz and bias current Ib have rectangular pulses in order to simplify an explanation similar to FIG. 3A. $t_0$ shows an initial condition; $t_1$ and $t_2$ show the time of the spin injection current Iz and bias current Ib rising respectively; and $t_3$ and $t_4$ show the time of the spin injection current Iz and bias current Ib falling respectively; and $t_s$ shows the time at which a finished condition is observed. Duration of each pulse is $t_3-t_1$ for the spin injection current Iz and $t_4-t_2$ for bias current Ib. The spin injection current Iz is switched off before $t_1$, is switched on at $t_1$, and is switched off at $t_3$. The bias current Ib is in an off state before $t_2$, is switched on at $t_2$, and is switched off at $t_4$.

As shown in FIG. 7, time $t_1$ of rise 91 of the spin injection current Iz and time $t_2$ of rise 92 of a pulse of the bias current Ib are separated to have different timing, and the time $t_2$ is delayed from the time $t_1$.

Here, since the duration $t_3-t_1$ and the duration $t_4-t_2$ are almost equal, a time $t_3$ of fall 93 of a pulse of the spin injection current Iz and a time $t_4$ of fall 94 of a pulse of the bias current Ib are different and the time $t_4$ is delayed from the time $t_3$.

As described above, since the time $t_4$ of fall 94 of a pulse of the bias current Ib is delayed from the time $t_3$ of fall 93 of a pulse of the spin injection current Iz, the bias current magnetic field Hx remains to assist the inversion operation on the direction of magnetization M11 of the memory layer 3 after turning off the spin injection current Iz. Thus, the inversion operation on the direction of magnetization M1 of the memory layer 3 can be stabilized, and the unstable operation area 83 shown in FIG. 4 can be prevented from occurring as later described.

According to the embodiment, since the first bit line 33 that supplies spin injection current Iz and the second bit line 34 that supplies bias current Ib are provided separately, thereby above-described settings being obtained.

Here, in order to stabilize the inversion operation on the direction of magnetization M1 of the memory layer 3, a time difference ($t_4-t_3$) between the time $t_3$ of fall 93 of a pulse of the spin injection current Iz and the time $t_4$ of fall 94 of a pulse of the bias current Ib is at least 10 ps (picoseconds).

Figure 8:
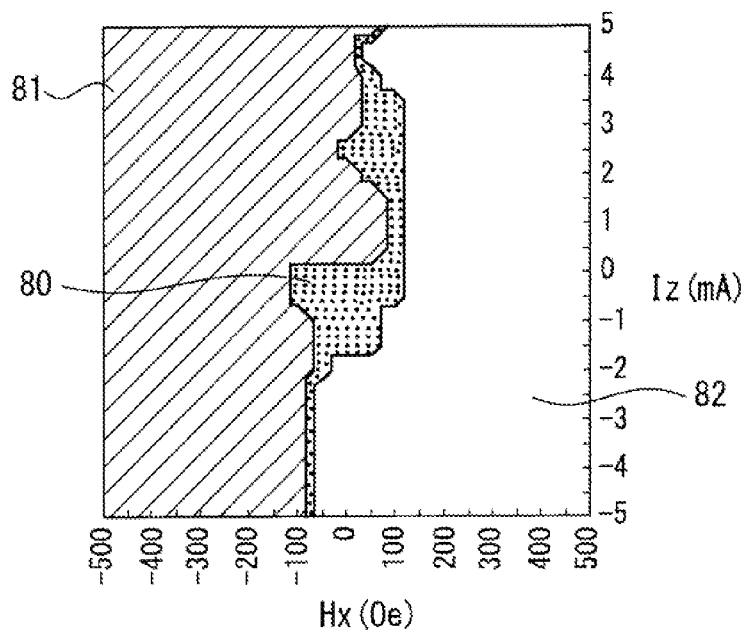
FIG. 8 is a diagram showing an example of a phase diagram according to an embodiment the present application.

Here, FIG. 8 shows an example of a measured phase diagram of a memory device according to the embodiment.

FIG. 8 shows an example in which duration of respective pulses $t_3-t_1$, $t_4-t_2$ is 5 ns and a time difference ($t_4-t_3$) between times of fall of two pulses is 5 ns, respectively.

Figure 4:
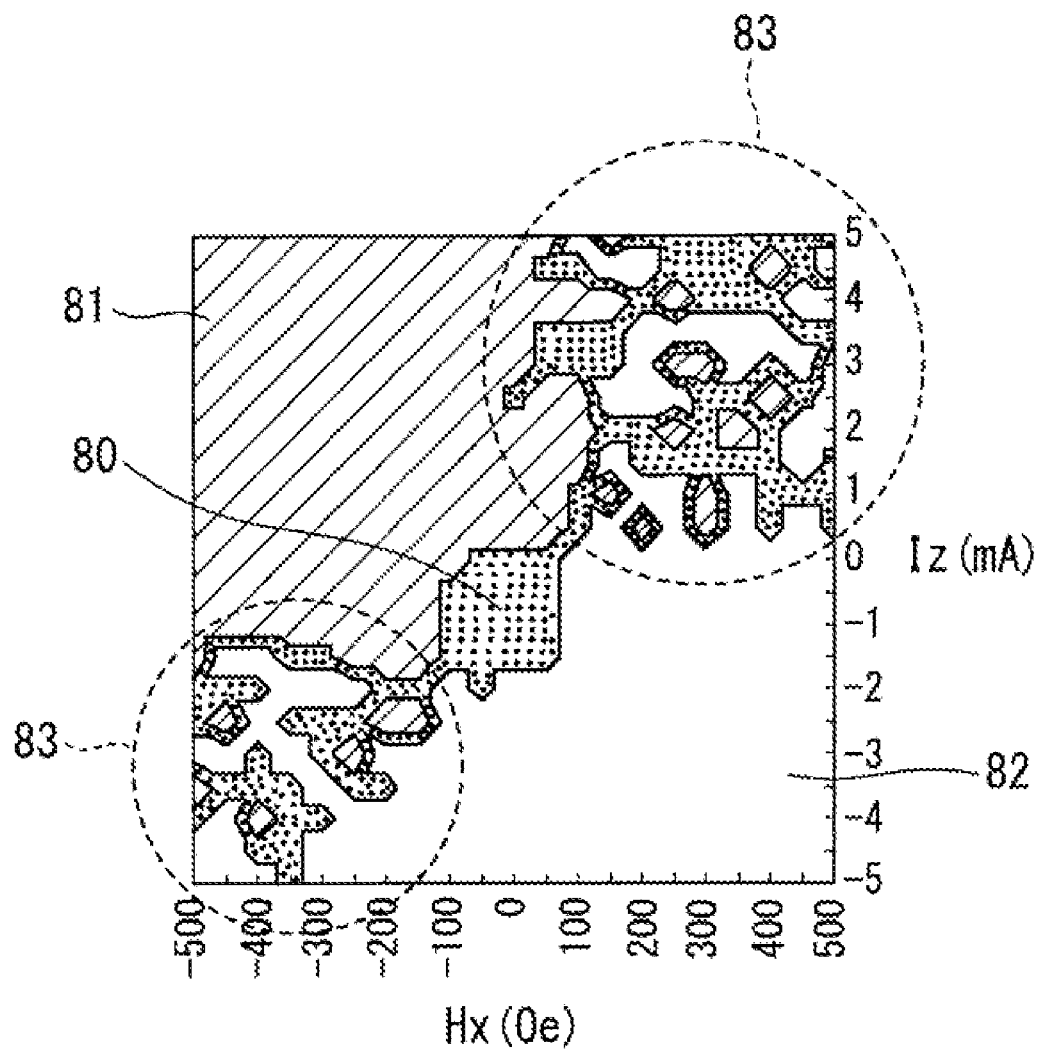
FIG. 4 shows an example of a phase diagram according to related art.

A difference between FIG. 8 and FIG. 4 represents an effect caused by allowing a bias current magnetic field Hx to remain 5 ns after turning off spin injection current Iz.

The unstable operation area 83 is widely observed on the first quadrant and third quadrant in FIG. 1, but it is understood that most of the unstable operation area 83 disappears in FIG. 8.

More specifically, since the second bit line 34 for generating the bias current magnetic field Hx is provided separately from the first bit line 33 and a time difference is provided to the falls of the pulses that flow through respective bit lines 33, 34, the unstable operation area 83 in the first quadrant changes to the area 82 where the memory cell is made to be the "1" state, and the unstable operation area 83 in the second quadrant changes to the area 81 where the memory cell is made to be the "0" state.

Accordingly, the area 81 where the memory cell is made to be the "0" state can be expanded to a range where the second quadrant and the third quadrant are combined, and the area 82 where the memory cell is made to be the "1" state can be expanded to a range where the first quadrant and the fourth quadrant are combined.

Therefore, condition of the inversion operation on the direction of magnetization M1 of the memory layer 3 can be set widely and freely.

According to the embodiment described above, since the second bit line 34 that supplies bias current Ib for applying a bias current magnetic field Hx to the memory element 1 is provided, the bias current Ib is supplied to the second bit line 34 and the bias current magnetic field Hx is supplied to the memory element 1, thereby changing the direction of magnetization M1 of the memory layer 3 in the memory element 1 by the operation of the bias current magnetic field Hx. Thus, an operation of recording information by inverting a direction of magnetization M1 of the memory layer 3 may be easily performed.

Also, since the second bit line 34 is provided separately from the first bit line 33 that supplies the spin injection current Iz, the bias current magnetic field Hx generated by the bias current Ib flowing through the second bit line 34 and the spin injection current Iz supplied to the first bit line 33 can be set independently. Accordingly, since the bias current Ib and spin injection current Iz can be controlled with independent amplitudes, independent codes and independent phases, conditions can be optimized so that power consumption is minimized and rewriting is performed at high speed, for example.

Furthermore, in the case where information is recorded by inverting the direction of magnetization M1 of the memory layer 3, pulse current of the spin current injection Iz is supplied to the first bit line 33 and pulse current of the bias current Ib is supplied to the second bit line 34, and time $t_4$ of fall 94 of the bias current Ib is delayed by 10 ps or more from a time $t_3$ of fall 93 of the spin injection current Iz. Accordingly, since an auxiliary bias current magnetic field Hx remains after turning off the spin injection current Iz, instability in the operation of recording information can be reduced and the information can be recorded stably and surely by inverting the direction of magnetization M1 of the memory layer 3 by spin-transfer.

Since an operation of recording information can be performed stably and securely as described above, a memory device that has characteristics of SpRAM such as having larger capacity, being reduced in size and consuming less electric power or the like caused by miniaturizing the memory element 1, can be obtained and further an operation of the memory device is stabilized and high reliability may be obtained.

Figure 9:
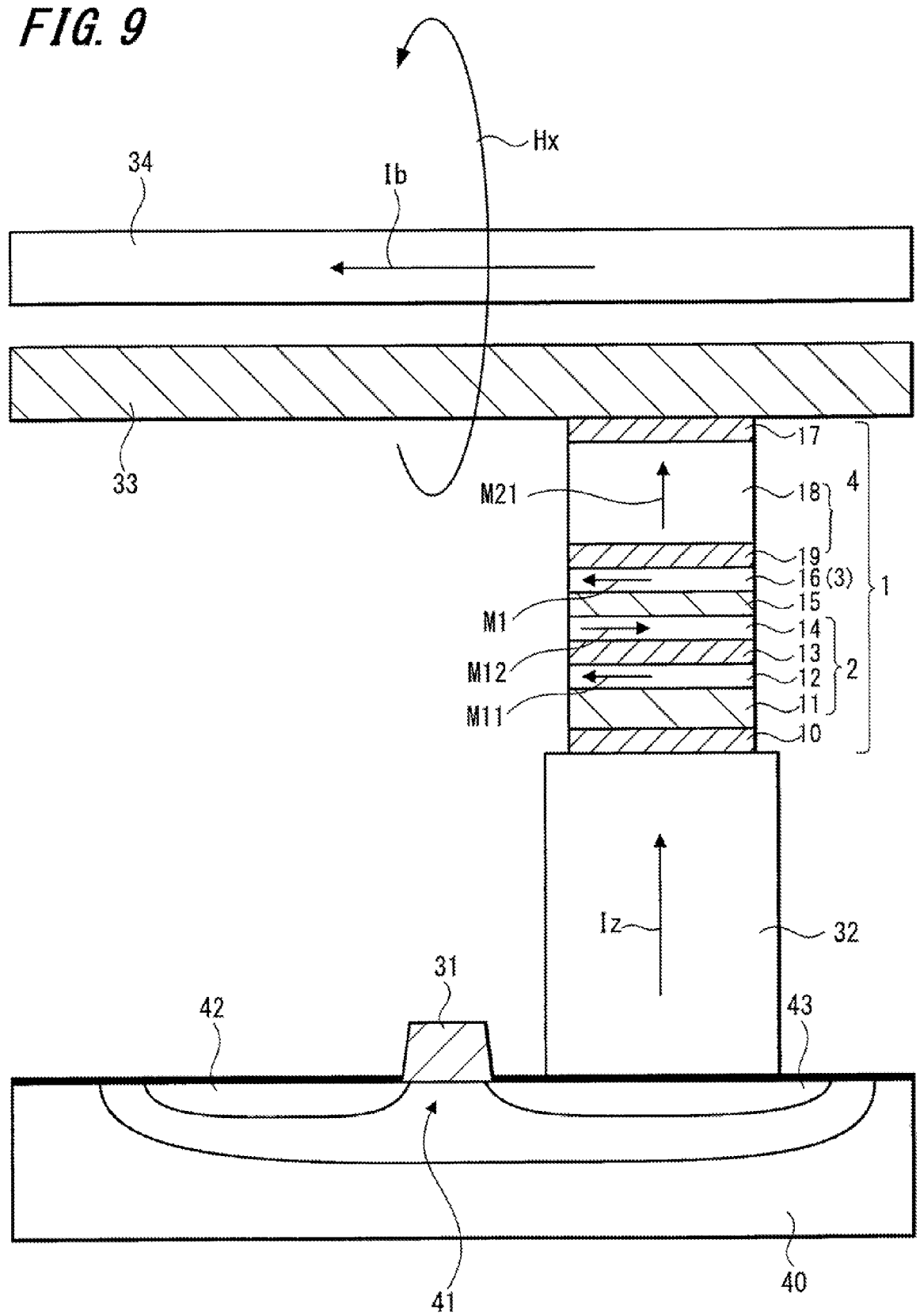
FIG. 9 is a schematic sectional view of a memory cell in a memory device according to another embodiment.

Next, FIG. 9 shows a schematic sectional view of a memory cell of a memory device according to another embodiment the present application.

According to the embodiment, in addition to a pinned layer 2 and a memory layer (magnetization free layer) 3, in particular, a magnetic layer 18 having vertical magnetic anisotropy is provided between a topcoat layer 17 and a ferromagnetic layer 16 that is the memory layer 3.

For example, a ferromagnetic material having a main component of Ni, Fe, Co or alloys thereof is used for the magnetic layer 18.

Furthermore, in order to prevent mutual diffusion of the ferromagnetic layer 16 and magnetic layer 18, a non-magnetic layer 19 is provided in between. A material such as Cu, Ta, Cr and Ru or the like may be used for the non-magnetic layer 19. The non-magnetic layer 19 and the magnetic layer 18 may be called a vertical film 4 as a whole.

The topcoat layer 17 prevents mutual diffusion, reduces contact resistance and prevents oxidation of the magnetic layer 18, and typically a material of Cu, Ta, TiN or the like may be used similarly to the above-described embodiment.

Magnetization M21 of the magnetic layer 18 causes strong spin torque for magnetization M1 of the memory layer 3 and reduces a threshold of spin injection current Iz required for magnetization inversion.

It should be noted that the direction of magnetization M21 of the magnetic layer 18 is pinned upward and in the stacking direction of the memory element 1, and is not changed by the spin injection current Iz and bias current magnetic field Hx.

According to the embodiment, timing (change over time) of a pulse of the spin injection current Iz and that of a pulse of the bias current Ib are similar to those of the preceding embodiment shown in FIG. 7.

Since the other structures are the same as those of the above-described embodiment shown in FIGS. 5 to 7, redundant explanations thereof are herein omitted.

As described above, since the magnetic layer 18 with vertical magnetic anisotropy is provided, a threshold of the spin injection current Iz required for magnetization inversion can be reduced.

However, although the threshold is lowered effectively, instability in the spin-transfer magnetization inversion phenomenon may be increased.

Accordingly, it may be difficult to stably invert magnetization with a polarity of the spin injection current Iz alone.

According to the preceding embodiment, relatively a passive effect of adding the bias current magnetic field Hx in addition to the spin injection current Iz is expected in order to invert the direction of magnetization M1 of the memory layer.

On the other hand, according to the present embodiment, there is such a difference that the direction of magnetization of the memory layer may not be inverted stably without the bias current magnetic field Hx being applied.

It should be noted that pulse duration $t_3-t_1$ of the spin injection current Iz and pulse duration $t_4-t_2$ of the bias current Ib need to be restricted to 10 ns or less in SpRAM having the vertical films 4 according to the present embodiment.

Figure 10:
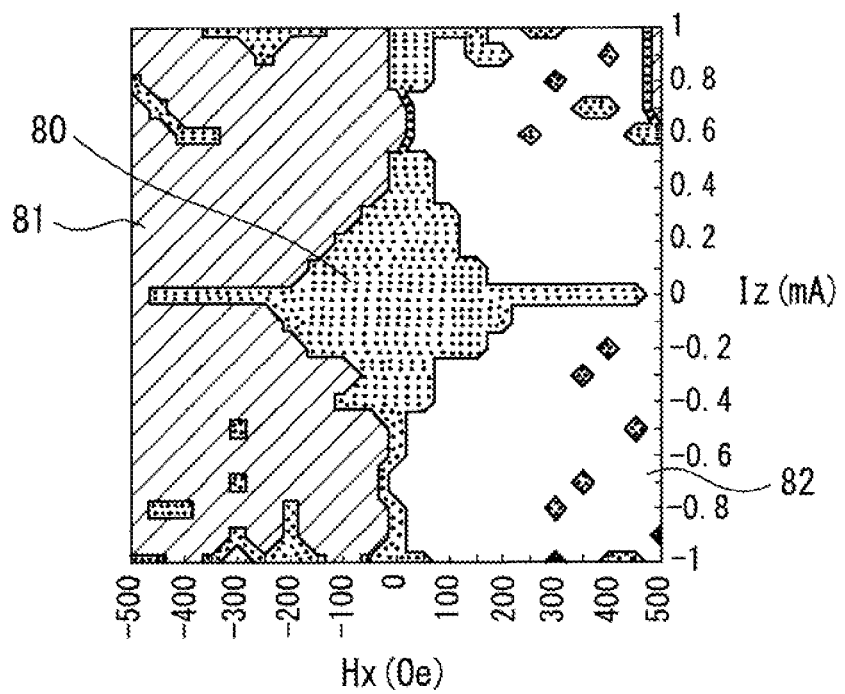
FIG. 10 is a diagram showing an example of a phase diagram according to another embodiment.

FIG. 10 shows an example of a measured phase diagram of a memory device according to the present embodiment.

According to the example shown in FIG. 10, the pulse duration $t_3-t_1$ and the pulse duration $t_4-t_2$ are set to 150 ps (picoseconds) respectively and time difference $(t_4-t_3)$ between the falls of two pulses is set to 50 ps.

As shown in FIG. 10, a hysteresis area 80 has the shape of an asteroid.

Also, the hysteresis area 80 is mostly shown on the line of a bias current magnetic field Hx=0. Thus, information may not be recorded to a memory cell to be "0" state or "1" state without applying the bias current magnetic field Hx even if a pulse peak value or a polarity of the spin injection current is changed.

Then, "0" state area 81 where a memory cell is in the "0" state and "1" state area 82 where a memory cell is in the "1" state exist in a range of the first quadrant and second quadrant combined or in a range of the second quadrant and third quadrant combined. Consequently, the memory cell may be in the "0" state and the "1" state stably by applying the bias current magnetic field Hx induced by the bias current Ib flowing through the second bit line 34.

According to the present embodiment, a first cause that determines the state of a memory cell is a bias current magnetic field Hx, and spin injection current Iz auxiliary operates for reducing a necessary bias current magnetic field Hx, similarly to MRAM using an asteroid characteristic.

According to the above-described embodiment, since a direction of magnetization M1 of the memory layer 3 in the memory element 1 can be changed using the bias current magnetic field Hx similarly to the preceding embodiment, information can be recorded easily by inverting a direction of magnetization M1 of the memory layer 3.

Further, since bias current Ib and spin injection current Iz can be controlled with independent amplitudes, independent codes and independent phases, conditions can be optimized so that power consumption is minimized and rewriting is performed at high speed, for example.

Further, since an auxiliary bias current magnetic field Hx remains after turning off the spin injection current Iz, instability in the operation of recording information can be reduced and the information can be recorded stably and surely by inverting the direction of magnetization M1 of the memory layer 3 by spin-transfer.

Since an operation of recording information can be performed stably and securely as described above, a memory device that has characteristics of SpRAM such as having larger capacity, being reduced in size and consuming less electric power or the like caused by miniaturizing the memory element 1, can be obtained and further an operation of the memory device is stabilized and high reliability may be obtained.

Furthermore, according to the present embodiment, since the magnetic layer 18 having vertical anisotropy is provided between the topcoat layer 17 and the ferromagnetic layer 16 that is the memory layer 3, a threshold of spin injection current Iz required for magnetization inversion can be reduced by causing strong spin torque to magnetization M1 of the memory layer 3.

Consequently, since spin injection current Iz is reduced, power consumed by the spin injection current Iz can be reduced.

Although duration of a pulse of spin injection current Iz and duration of a pulse of bias current Ib are equal in respective embodiments described above, those may be different from each other.

According to embodiments, relationships between two pulses such as an order of rising and the length of time (duration) are not particularly limited as long as information is recorded (a direction of magnetization of a memory layer is inverted) by applying both the spin injection current Iz and bias current Ib, specifically, by overlapping these pulses, and as long as a pulse of bias current Ib falls at least 10 ps after a fall of a pulse of spin injection current Iz.

Figure 11:
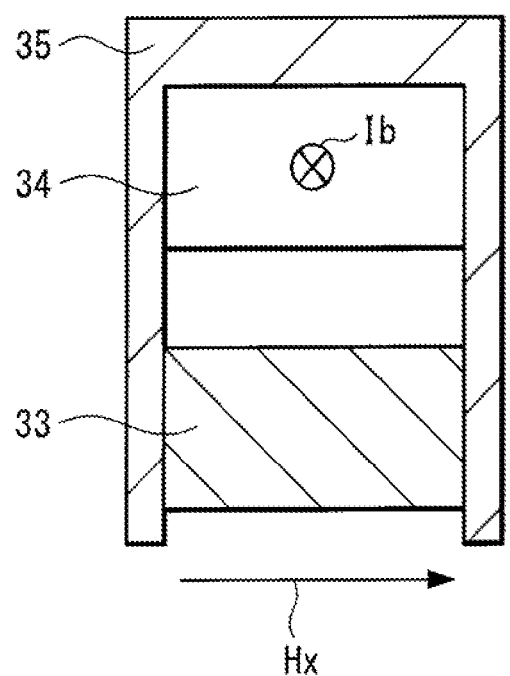
FIG. 11 is a schematic side-sectional view of bit lines of a relevant portion according to further another embodiment.

Next, FIG. 11 shows a schematic side-sectional view of a bit line of a relevant portion of a memory device according to further another embodiment.

According to the embodiment, in particular, a magnetic material 35 having high magnetic permeability is provided around a first bit line 33 and a second bit line 34.

For example, a ferromagnetic material including Ni, Fe, Co or alloys thereof as a main component may be used for the magnetic material 35.

The magnetic material 35 may be formed around the bit lines 33, 34 by sputtering or deposition, for example.

Here, in order to electrically insulate the first bit line 33 from the second bit line 34, it is efficient to provide an insulating layer of 1 nm or more between the first and second bit lines 33, 34 and the magnetic material 35.

The other structures are the same as those of the preceding embodiment shown in FIGS. 5 to 7.

In the above-described embodiments, intensity of a bias current magnetic field Hx induced by bias current Ib is proportional to bias current Ib flowing through the second bit line 34.

In order to reduce electric power consumed by SpRAM, efficiency in causing a bias current magnetic field Hx needs to be improved as much as possible.

According to the present embodiment, since the magnetic material 35 is provided, a bias current magnetic field Hx induced by bias current Ib from an edge portion of the magnetic material 35 can be applied to a memory layer 3 in the memory element 1 efficiently.

Further, it is desirable that an edge portion of the magnetic material 35 is formed as close as possible to the memory layer 3 in the memory element 1, so that the bias current magnetic field Hx can be applied efficiently to the memory layer 3 in the memory element 1.

Therefore, preferably, the edge portion of the magnetic material 35 protrudes from the bottom surface of the first bit line 33 by 1 nm or more.

Furthermore, it is desirable that the magnetic permeability of the magnetic material 35 is 1 or more.

According to the embodiment, effectiveness similar to that of the preceding embodiments can be obtained.

Further, according to the embodiment, since the magnetic material 35 with high magnetic permeability is provided around the first bit line 33 and second bit line 34, a bias current magnetic field Hx can be applied efficiently to the memory layer 3 in the memory element 1 from an edge portion of the magnetic material 35. Hence, a bias current magnetic field Hx equivalent to those in the preceding embodiments can be obtained with bias current Ib smaller than that in those embodiments. Thus, the bias current Ib is reduced and as a result, power consumption by SpRAM can be reduced.

According to the embodiments described above, the first bit line 33 for supplying spin injection current Iz and the second bit line 34 for supplying bias current Ib that causes the bias current magnetic field Hx are arranged vertically in parallel.

According to an embodiment, wiring for supplying bias current that causes a bias current magnetic field is not necessarily parallel with wiring for supplying spin injection current and, for example, these wirings may be perpendicular to each other. In the case where two wirings are perpendicular to each other, a wiring that supplies the bias current is not a bit line, but the other wiring.

According to an embodiment, a film structure of a memory element 1 is not limited to that shown in each of the embodiments described above, and various other film structures may be employed.

According to each of the embodiments described above, the pinned layer 2 has a multi-layered ferri-structure including two layers of magnetization pinned layers 12, 14 and a non-magnetic layer 13. However, the magnetization pinned layer may be configured to have a single ferromagnetic layer.

Further, positions of a pinned layer and a memory layer may be inverted so that the memory layer is provided under the pinned layer.

Furthermore, an intermediate layer between the pinned layer and the memory layer is formed of a non-magnetic conductive layer instead of a tunnel insulating layer to configure a GMR element.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory device comprising:
a memory element including a memory layer that retains information based on a magnetization state of a magnetic material and a magnetization pinned layer in which a magnetization direction is pinned and which is provided for the memory layer through a non-magnetic layer, current flowing in a stacking direction in the memory element to change a magnetization direction of the memory layer, so that information is recorded in the memory layer;
a first wiring that supplies current flowing in the stacking direction of the memory element; and
a second wiring that supplies current to apply a current magnetic field to the memory element, wherein when information is recorded, a first pulse current is supplied to the first wiring, a second pulse current is supplied to the second wiring, and the second pulse current falls at least 10 picoseconds after the first pulse current falls.

2. A memory device according to claim 1, wherein a magnetic layer magnetized in the stacking direction is arranged in a vicinity of the memory layer in the memory element.

3. A memory device according to claim 2, wherein duration of the first pulse current and that of the second pulse current are 10 nanoseconds or less.

4. A memory device according to claim 1, wherein the first wiring and the second wiring are arranged approximately in parallel, a magnetic material with high magnetic permeability being arranged to surround the first wiring and the second wiring, the current magnetic field being applied to the memory element from an edge of the magnetic material.

5. A memory device according to claim 4, wherein magnetic permeability of the magnetic material is 1 or more.

* * * * *